(12) United States Patent
Lerzer

(10) Patent No.: US 6,343,368 B1
(45) Date of Patent: Jan. 29, 2002

(54) METHOD AND SYSTEM FOR FAST MAXIMUM A POSTERIORI DECODING

(75) Inventor: Jürgen Lerzer, Freystadt/Forchheim (DE)

(73) Assignee: Telefonaktiebolaget LM Ericsson (publ), Stockholm (SE)

( * ) Notice: Subject to any disclaimer, the term of this patent is extended or adjusted under 35 U.S.C. 154(b) by 0 days.

(21) Appl. No.: 09/252,028

(22) Filed: Feb. 18, 1999

(30) Foreign Application Priority Data

Dec. 18, 1998 (WO) .............................. PCT/IB98/02068

(51) Int. Cl.$^7$ ............................................. H03M 13/00
(52) U.S. Cl. ...................................................... 714/796
(58) Field of Search ................................ 714/794–796; 375/341, 262

(56) References Cited

U.S. PATENT DOCUMENTS

| 5,175,867 | A | | 12/1992 | Wejke et al. ................ 455/435 |
| 5,603,081 | A | | 2/1997 | Raith et al. .................. 455/439 |
| 5,933,462 | A | * | 8/1999 | Viterbi et al. ............... 375/341 |
| 6,028,899 | A | * | 2/2000 | Petersen ...................... 375/341 |
| 6,233,290 | B1 | * | 5/2001 | Raphaeli ..................... 374/341 |

FOREIGN PATENT DOCUMENTS

| GB | 2 316 587 | 2/1998 |
| WO | WO96/13105 | 5/1996 |
| WO | WO98/20617 | 5/1998 |

OTHER PUBLICATIONS

Liu et al., MAP algorithms for decoding linear block codes based on sectionalized trellis diagrams, IEEE, pp. 562566, Nov. 1998.*

Gross et al. simplified MAP algorithm suitable for implementation of turbo decoders, IEEE, pp. 1577–1578, Aug. 1998.*

"Optimal Decoding of Linear Codes for Minimizing Symbol Error Rate", L.R. Bahl et al, IEEE Transactions on Information Theory, Mar. 1974, vol. IT–20, No. 2, pp. 284–287.

"Iterative Decoding of Binary Block and Convolutional Codes", J. Hagenauer et al, IEEE Transactions on Information Theory, Mar. 1996, vol. 42, No. 2, pp. 429–445.

"An Intuitive Justification and a Simplified Implementation of the MAP Decoder for Convolutional Codes", A.J. Viterbi, IEEE Journal on Selected Areas in Communications, Feb. 1998, vol. 16, No. 2, pp. 260–264.

"Implementation and Performance of a Turbo/MAP Decoder", S.S. Pietrobon, International Journal of Satellite Communications, Feb. 21, 1997, pp. 1–45.

Patent Abstracts of Japan, vol. 095, No. 006, Jul. 31, 1995 & JP 07 066736 A (Sony Corp.), Mar. 10, 1995.

Patent Abstracts of Japan, vol. 097, No. 010, Oct. 1997 & JP 09 148943 A, (NEC Corp.), Jun. 6, 1997.

Herbert Dawid, et al., "Map Channel Decoding: Algorithm And VLSI Architecture", VLSI Signal Processing, Proceedings of IEEE Workshop on VLSI Signal Processing, Veldhoven, Netherlands, vol. VI, Oct. 20–22, 1993, pp. 141–149, XP002113702.

S. Meier, "A Viterbi Decoder Architecture Based On Parallel Processing Elements", Communications: Connecting The Future, San Diego, vol. 2, Dec. 2–5, 1990, pp. 1323–1327, pp. 429–445, XP000221098.

European Search Report re: RS 102685 US Date of Mailing of search: Aug. 30, 1999.

* cited by examiner

Primary Examiner—Phung M. Chung
Assistant Examiner—Shelby A Chase
(74) Attorney, Agent, or Firm—Burns, Doane, Swecker & Mathis, L.L.P.

(57) ABSTRACT

Processing delay associated with MAP decoding (and variants thereof) is reduced by processing forward and reverse state metrics in parallel. Further reductions in processing complexity can be achieved by omitting redundant operations and multiplexing processing units' functionality.

24 Claims, 7 Drawing Sheets

METHOD AND SYSTEM FOR FAST MAXIMUM A POSTERIORI DECODING

RELATED PRIORITY APPLICATION

This application is related to, and claims priority from, International Patent Application No. PCT/IB98/02068, entitled "Telecommunication 1", filed on Dec. 18, 1998, the disclosure of which is expressly incorporated hereby reference.

BACKGROUND

The present invention generally relates to error handling in the field of communication systems and, more particularly, to decoding signals, which have been transmitted using error correction codes, using a maximum a posteriori (MAP) decoding technique.

The growth of commercial communication systems and, in particular, the explosive growth of cellular radiotelephone systems, have compelled system designers to search for ways to increase system capacity without reducing communication quality beyond consumer tolerance thresholds. One technique to achieve these objectives involved changing from systems, wherein analog modulation was used to impress data onto a carrier wave, to systems wherein digital modulation was used to impress the data on carrier waves.

In wireless digital communication systems, standardized air interfaces specify most of the system parameters, including modulation type, burst format, communication protocol, etc. For example, the European Telecommunication Standard Institute (ETSI) has specified a Global System for Mobile Communications (GSM) standard that uses time division multiple access (TDMA) to communicate control, voice and data information over radio frequency (RF) physical channels or links using a Gaussian Minimum Shift Keying (GMSK) modulation scheme at a symbol rate of 271 ksps. In the U.S., the Telecommunication Industry Association (TIA) has published a number of Interim Standards, such as IS-54 and IS-136, that define various versions of digital advanced mobile phone service (D-AMPS), a TDMA system that uses a differential quadrature phase shift keying (DQPSK) modulation scheme for communicating data over RF links.

TDMA systems subdivide the available frequency band into one or more RF channels, which are further divided into a number of physical channels corresponding to timeslots in TDMA frames. Logical channels are formed of one or several physical channels where modulation and coding is specified. In these systems, the mobile stations communicate with a plurality of scattered base stations by transmitting and receiving bursts of digital information over uplink and downlink RF channels.

The growing number of mobile stations in use today has generated the need for more voice and data channels within cellular telecommunication systems. As a result, base stations have become more closely spaced, with an increase in interference between mobile stations operating on the same frequency in neighboring or closely spaced cells. Although digital techniques provide a greater number of useful channels from a given frequency spectrum, there still remains a need to reduce interference, or more specifically to increase the ratio of the carrier signal strength to interference, (i.e., carrier-to-interference (C/I) ratio).

In order to provide various communication services, a corresponding minimum user bit rate is required. For example, for voice and/or data services, user bit rate corresponds to voice quality and/or data throughput, with a higher user bit rate producing better voice quality and/or higher data throughput. The total user bit rate is determined by a selected combination of techniques for speech coding, error correction (channel coding), modulation scheme and the number of assignable resources (e.g., codes, time slots, frequencies, etc.) per connection.

Of particular interest in this specification are error correction or channel codes. Digital communication systems employ various techniques to handle erroneously received information. Generally speaking, these techniques include those which aid a receiver to correct the erroneously received information, e.g., forward error correction (FEC) techniques, and those which enable the erroneously received information to be retransmitted to the receiver, e.g., automatic retransmission request (ARQ) techniques. FEC techniques include, for example, convolutional or block coding of the data prior to modulation, which coding is intended to permit the correction of errors introduced by noise and interference. FEC coding involves representing a certain number of data bits using a larger number of code bits. Thus, it is common to refer to convolutional codes by their code rates, e.g., 1/2 and 1/3, wherein the lower code rates provide greater error protection but lower user bit rates for a given channel bit rate.

At the receiver side, the received sequence is decoded to allow further processing of the data. Of course, the channel over which the signal has been transmitted makes this decoding process more challenging. This challenge is graphically depicted in FIG. 1. Therein, a stream of symbols u is input to a convolutional encoder 10. The encoded symbol stream x is transmitted over a transmission channel 12, e.g., over an air interface or a wireline, and received by a receiving entity as symbol stream y to reflect the impact of the channel on the transmitted signal. The MAP decoder 14 interprets the received symbol stream y to output symbol stream û, which is an estimate of the original symbol stream u. Note that in order to simplify this discussion, descriptions of various other processes which are well known in the art, e.g., the modulation and demodulation processes performed at the transmitter and receiver side, respectively, have been omitted.

The MAP decoding algorithm which can be employed in decoder 14, also known as the symbol-by-symbol Maximum-A-Posteriori algorithm or BCJR algorithm, was proposed by Bahl, Cocke, Jelinek and Raviv in "Optimal Decoding of Linear Codes for Minimizing Symbol Error Rate", IEEE Trans. Inform. Theory, Vol. IT-20, pp.284–287, March 1974, the disclosure of which is incorporated here by reference. Variations on the MAP algorithm have also been proposed, which variations are more commercially feasible from an implementation point of view. For example, the Log-Map (processing performed in the logarithmic domain) and Max-Log-Map (a simplified version of Log-Map) algorithms have been described in the literature, e.g., "Iterative Decoding of Binary Block and Convolutional Codes", to Hagenauer et al., IEEE Trans. Inform. Theory, Vol. IT-42, pp. 429–445, March 1996, the disclosure of which is incorporated here by reference.

Due to their computational complexity and relatively moderate performance increases relative to less complex decoders (e.g., Viterbi decoders) under most conditions, MAP decoders have enjoyed relatively little popularity since their inception in the 1970's. However, as the development of error correction coding has advanced, interest in MAP decoders has been rekindled as Shannon's limit is approached. Those skilled in the art will appreciate that Shannon's limit establishes the smallest ratio of energy per bit to single sided noise density ($E_b/N_0$) for reliable transmission. Although Shannon proved this limit in the late 1940's, error correction codes have still not been developed which provide this theoretically possible performance. However, a recent class of so-called "turbo" codes comes much closer to operating at Shannon's limit. With the advent of these, and other, new types of error correction codes, the MAP decoder has returned to prominence.

The detailed operation of the MAP algorithm is described below, and the metrics involved in the MAP algorithm will be more readily understood upon review of the equations found therein. One possible implementation of a MAP decoder is to simply provide a decoder which implements the MAP algorithm in a straightforward manner. That is, for a received sequence having N symbols, in a first step calculating and storing all of the branch transition metrics and the forward state metrics. After the Nth branch transition metric and Nth forward state metric have been calculated, then calculating all N reverse state metrics. Finally, after the reverse state metrics have been calculated, the likelihood ratios are calculated. However, the processing delay involved in such a straightforward implementation of the MAP decoding process is relatively high even when using powerful processors to perform the computations. Today's communication systems demand higher and higher bitrates, and are less and less tolerant of processing delays.

One attempt found in the literature to reduce the processing delays associated with implementing the MAP algorithm is found in the disclosure of WO 98/20617 entitled "Soft Decision Output Decoder for Decoding Convolutionally Encoded Codewords", the disclosure of which is expressly incorporated here by reference. Therein, a Log-Map decoder is described wherein a first "generalized" Viterbi decoder begins at an initial state $t_0$ and provides a plurality of forward state metrics α for each state at each time interval over a window length 2L. A second "generalized" Viterbi decoder is also provided which starts at a second time $t_{2L}$ and provides a plurality of reverse state metrics β for each state at each time interval. A processor then performs a dual maxima computation at each state using a forward state metric for a first state, a reverse state metric for a second state and the branch transition metric for the path between the first and second states.

Although this MAP decoding implementation may reduce the processing delay relative to a straightforward implementation of the MAP algorithm, it has a relatively high complexity and is suboptimal in the sense that initial estimates are used at each start of the second "generalized" Viterbi decoder for calculating the reverse state metrics. Accordingly, it would be desirable to provide a MAP decoder implementation with reduced processing delay, with limited (if any) additional complexity and without resorting to suboptimal variations of the algorithm to enable efficient decoding of the powerful error correction codes which are being considered for next generation communication systems.

SUMMARY

These and other drawbacks and limitations of conventional methods and systems for communicating information are overcome according to the present invention, the processing delay can be reduced (by, for example, a factor of approximately two relative to a straightfoward implementation) by implementing a decoder and decoding technique wherein the Forward State Metric Calculation (FSMC) and the Reverse State Metric Calculation (RSMC) are processed in parallel. Implementation complexity is also minimized relative to, e.g., WO98/20617 and can be further reduced by recognizing the processing timing associated with various tasks and eliminating unnecessary additional processing units, e.g., branch transition metric calculation units and likelihood ratio calculating units.

BRIEF DESCRIPTION OF THE DRAWINGS

These and other objects, features and advantages of the present invention will become more apparent upon reading from the following detailed description, taken in conjunction with the accompanying drawings, wherein.

DETAILED DESCRIPTION

Figure 1:
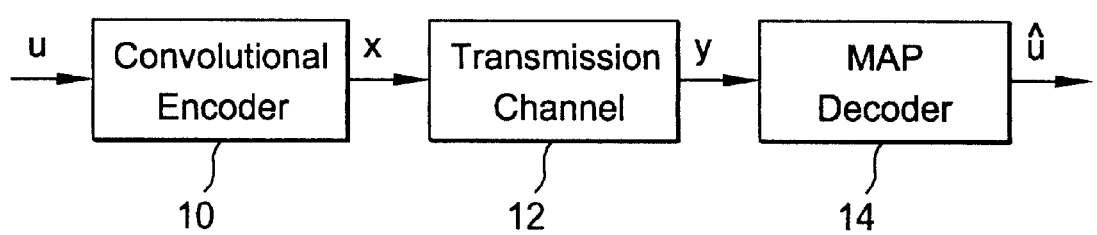
FIG. 1 is a general block diagram illustrating transmission and reception of a signal over a channel involving the usage of error correction coding.

In the following description, for purposes of explanation and not limitation, specific details are set forth, such as particular circuits, circuit components, techniques, etc. in order to provide a thorough understanding of the present invention. However, it will be apparent to one skilled in the art that the present invention may be practiced in other embodiments that depart from these specific details. In other instances, detailed descriptions of well-known methods, devices, and circuits are omitted so as not to obscure the description of the present invention.

To initialize this discussion it is appropriate to provide some additional details regarding the MAP decoding algorithm, as well as exemplary variants such as the Log-MAP algorithm and the Max-Log-MAP algorithm to provide some context in which to consider the present invention. In the following discussion certain variables are used, as defined below.

$S_k$ is the state for the k-th node in the trellis.

The metric calculations involve probabilities whose notation is given as follows. Let A, B and C be events, then the following definitions are valid:

P(A): probability of the event A

P(A, B): probability of the joint events A and B

P(A, B, C): probability of the joint events A, B and C

P(A|B): conditional probability of the event A given the occurrence of the event B P(A, B|C): conditional probability of the joint events A and B given the occurrence of the event C P(A|B, C): conditional probability of the event A given the occurrence of the joint events B and C

The MAP Algorithm

The MAP Algorithm includes the following four steps:

1. Branch Transition Metric Calculation (BTMC): Calculation of the Branch Transition Metrics $\gamma_k(S_{k-1},S_k)$ from the symbols $y_k$ received over the channel 12:

$$\gamma_k(S_{k-1},S_k)=P(y_k,S_k|S_{k-1})=P(y_k|S_{k-1},S_k)\cdot P(S_k|S_{k-1}) \quad (1)$$

2. Forward State Metric Calculation (FSMC): Recursive calculation of the Forward State Metrics $\alpha_k(S_k)$ with initial metrics $\alpha_0(S_0)$, which are defined according to the initial state of the convolutional encoder:

$$\alpha_k(S_k) = \sum_{S_{k-1}} \alpha_{k-1}(S_{k-1})\cdot \gamma_k(S_{k-1},S_k) \quad (2)$$

3. Reverse State Metric Calculation (RSMC): Recursive calculation of the Reverse State Metrics $\beta_k(S_k)$ with initial metrics $\beta_N(S_N)$, which are defined according to the final state of the convolutional encoder:

$$\beta_{k-1}(S_{k-1}) = \sum_{S_k} \beta_k(S_k)\cdot \gamma_k(S_{k-1},S_k) \quad (3)$$

4. Likelihood Ratio Calculation (LRC): Calculation of the soft outputs $\Lambda_k$ which are equivalent to the Likelihood Ratio of $u_k$ given y. Note that the summations of numerator and denominator are over those pairs of states for which $u_k=+1$ and $u_k=-1$, respectively:

$$\Lambda_k = \frac{P(u_k = +1|y)}{P(u_k = -1|y)} \quad (4)$$

$$= \frac{\sum_{S_{k-1},S_k,u_k=+1} P(S_{k-1},S_k,y)}{\sum_{S_{k-1},S_k,u_k=-1} P(S_{k-1},S_k,y)}$$

$$= \frac{\sum_{S_{k-1},S_k,u_k=+1} \alpha_{k-1}(S_{k-1})\cdot \gamma_k(S_{k-1},S_k)\cdot \beta_k(S_k)}{\sum_{S_{k-1},S_k,u_k=-1} \alpha_{k-1}(S_{k-1})\cdot \gamma_k(S_{k-1},S_k)\cdot \beta_k(S_k)}$$

The Log-MAP Algorithm

If the logarithms of all parameters in equations (1–4) are taken and the symbols $a=\ln\alpha$, $b=\ln\beta$, $c=\ln\gamma$ and $L=\ln\Lambda$ are defined, the equations (1–4) for BTMC, FSMC, RSMC and LRC become the equations (1'–4') below and the four steps in processing the Log-MAP Algorithm are:

1. BTMC:

$$c_k(S_{k-1},S_k)=\ln(P(y_k|S_{k-1},S_k))+\ln(P(S_k|S_{k-1})) \quad (1')$$

2. FSMC with initial metrics $a_0(S_0)=\ln(\alpha_0(S_0))$:

$$a_k(S_k) = \ln\left(\sum_{S_{k-1}} e^{a_{k-1}(S_{k-1})+c_k(S_{k-1},S_k)}\right) \quad (2')$$

3. RSMC with initial metrics $b_0(S_0)=\ln(\beta_0(S_0))$:

$$b_{k-1}(S_{k-1}) = \ln\left(\sum_{S_k} e^{b_k(S_k)+c_k(S_{k-1},S_k)}\right) \quad (3')$$

4. LRC:

$$L_k = \ln\left(\sum_{S_{k-1},S_k,u_k=+1} e^{a_{k-1}(S_{k-1})+c_k(S_{k-1},S_k)+b_k(S_k)}\right) - \quad (4')$$

$$\ln\left(\sum_{S_{k-1},S_k,u_k=-1} e^{a_{k-1}(S_{k-1})+c_k(S_{k-1},S_k)+b_k(S_k)}\right)$$

The Max-Log-MAP Algorithm

If the approximation:

$$\ln\left(\sum_i e^{x_i}\right) = \max_i(x_i) \quad (5)$$

is used, the equations (1'–4') become (1"–4") below and the Log-MAP Algorithm becomes the Max-Log-MAP Algorithm. The four steps in the processing of the Max-Log-MAP Algorithm are then as follows:

1. BTMC:

$$c_k(S_{k-1},S_k)=\ln(P(y_k|S_{k-1},S_k))+\ln(P(S_k|S_{k-1})) \quad (1'')$$

2. FSMC with initial metrics $a_0(S_0)=\ln(\beta_0(S_0))$:

$$a_k(S_k) = \max_{S_{k-1}}(a_{k-1}(S_{k-1}) + c_k(S_{k+1},S_k)) \quad (2'')$$

3. RSMC with initial metrics $b_0(S_0)=\ln(\beta_0(S_0))$ $$b_{k-1}(S_{k-1}) = \max_{S_k}(b_k(S_k) + c_k(S_{k-1},S_k)) \quad (3'')$$

4. LRC:

$$L_k = \max_{S_{k-1},S_k,u_k=+1}(a_{k-1}(S_{k-1}) + c_k(S_{k-1},S_k) + b_k(S_k)) - \quad (4'')$$

$$\max_{S_{k-1},S_k,u_k=-1}(a_{k-1}(S_{k-1}) + c_k(S_{k-1},S_k) + b_k(S_k))$$

As with many algorithms found in the literature, the MAP theory is interesting, but implementation of the theory poses realistic problems to design engineers. In the case of the MAP algorithm and variants thereof which are described above, one such problem involves processing delay. An exemplary implementation was described above with respect to WO 98/20617, which implementation is intended to reduce the processing delay associated with the MAP algorithm. Exemplary embodiments of the present invention provide an alternative implementation which also reduces processing delay, with less computational complexity and without employing estimated values for each reverse state metric calculation.

Figure 2:
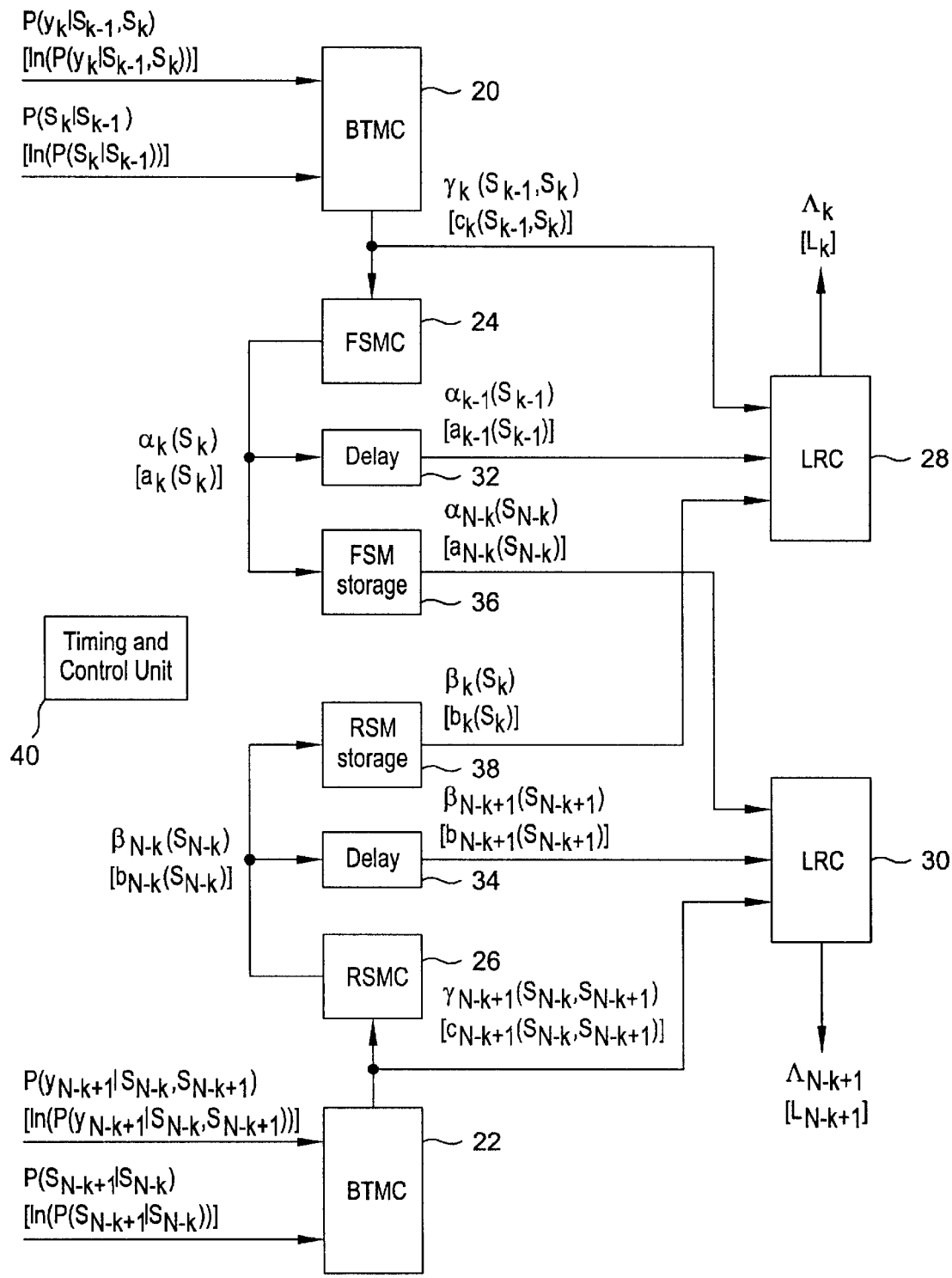
FIG. 2 is a block diagram of an exemplary decoder according to exemplary embodiments of the present invention.

A block diagram of an exemplary embodiment of the present invention is shown in FIG. 2. Since the present invention is applicable to the original MAP algorithm, as well as the Log-MAP and Max-Log-MAP (and any other variants) algorithms, the exemplary embodiments herein provide signal name references in the figures and ensuing description as follows. The signal names valid for the conventions described above for the MAP algorithm are given as the top or first signal reference on each signal line. After or below the MAP signal name, the alternative signal name valid for the naming convention associated with the Log-MAP algorithm or the Max-Log-MAP algorithm is provided in brackets. For example, looking at the upper left hand corner of FIG. 2, the signal line associated with the top input to BTMC unit 20 has a MAP signal reference of $P(y_k|S_{k-1}, S_k)$ and a Log-MAP (or Max-Log-MAP) signal reference of in $(P(y_k|S_{k-1}, S_k))$ The exemplary decoder of FIG. 2 has a number of different functional blocks which operate as follows in accordance with the present invention. The BTMs are calculated in BTMC units 20 and 22 in a manner which is determined by the particular version of the MAP algorithm which is employed by the decoder. For example, the branch metrics are calculated according to equation (1) if the MAP algorithm is used, according to equation (1') if the Log-MAP algorithm is used, or according to equation (1") if the Max-Log-MAP algorithm is used.

Analogously, the forward state metrics are calculated in FSMC unit 24 in a manner which depends upon the MAP variant to be used in the decoder. That is, the FSMs are calculated according to equation (2), if the MAP algorithm is used, according to equation (2'), if the Log-MAP algorithm is used, and according to equation (2"), if the Max-Log-MAP algorithm is used. Similarly, the reverse state metrics are calculated in RSMC unit 26 according to equation (3), if the MAP algorithm is used, according to equation (3'), if the Log-MAP algorithm is used, and according to equation (3"), if the Max-Log-MAP algorithm is used.

The likelihood ratios are calculated in LRC units 28 and 30 using the branch metrics, forward state metrics and reverse state metrics determined in units 20, 22, 24 and 26. Specifically, the likelihood ratios are calculated according to equation (4), if the MAP algorithm is used, according to equation (4'), if the Log-MAP algorithm is used, and according to equation (4"), if the Max-Log-MAP algorithm is used.

FIG. 2 also includes delay elements 32 and 34, as well as storage elements 36 and 38. These elements are used to buffer and control the presentation of metric values to the LRC units 28 and 30, by timing and control unit 40. To avoid obscuring the figure, the signal lines from the timing and control unit 40 to the other functional blocks of FIG. 2 have been omitted. However, those skilled in the art will appreciate that timing and control unit 40 controls the timing (input/output) of each block in FIG. 2 such that metric values are calculated and forwarded in, for example, the manner described below with respect to FIGS. 3–5 and that signal lines can be provided between the timing and control unit 40 and each functional block in FIG. 2.

Figure 3:
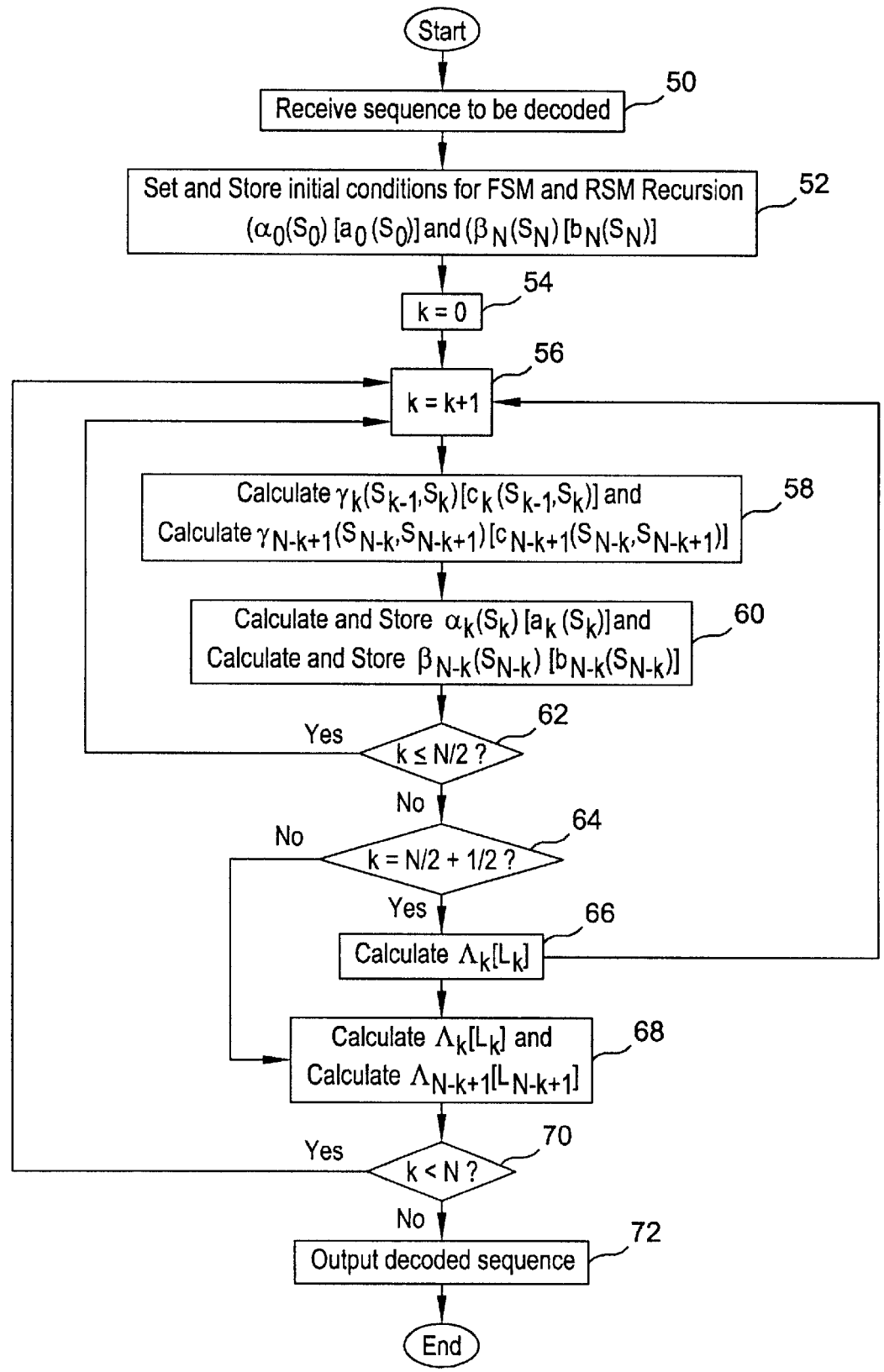
FIG. 3 is a flow chart which depicts an exemplary decoding process according to exemplary embodiments of the present invention.

To more readily understand the manner in which an exemplary MAP decoder operates according to the present invention, FIG. 3 is a flow chart which illustrates an exemplary decoding operation. Therein, at step 50, a sequence to be decoded is received. This received sequence may, for example, have been previously processed in the receiver (e.g., downconverted, demodulated, etc.) in various ways which will be apparent to those skilled in the art. Next, at step 52, the initial conditions to be used by the forward state metric and reverse state metric recursions are set for units 24 and 26, respectively. The initial conditions for the FSMC unit are determined from the initial state of the convolutional encoder (which is typically fixed and, therefore, known by the receiver). The initial conditions for the RSMC unit are determined from the final state of the convolutional encoder, if the final state is known, e.g., when the convolutional encoder employs a terminating convolutional process. Otherwise, e.g,. when the convolutional encoder employs a tailing convolutional process, an estimate of the final state can be used.

For example, consider a system wherein the convolutional encoder in the transmitter has a constraint length of three, i.e, four different, possible states, and wherein the receiver employs the Log-MAP algorithm implemented according to the present invention. If the initial state of the encoder was, for example, $S_0=0$, then the initial FSMs can be set to $a_0(S_0=0)=0$ and $a_0(S_0=1)=a_0(S_0=2)=a_0(S_0=3)=-\infty$. If the final state is known to be, for example, $S_N=2$, then the initial RSMs can be set to $b_N(S_N=2)=0$ and $b_N(S_N=0)=b_N(S_N=1)=b_N(S_N=3)=-\infty$. Otherwise, if the final state of the convolutional encoder is not known by the receiver, then the initial RSMs can be set to $b_N(S_N=0)=b_N(S_N=1)=b_N(S_N=2)=b_N(S_N=3)=0$.

Returning now to FIG. 3, an index, k, which is used as a reference in the decoding process is initialized at step 54. This index may, for example, correspond to time steps which are chosen based on the symbol rate and/or sampling rate. At this time, the FSMC unit 24 and the RSMC 26 are initialized with initial FSMs and RSMs, respectively, stored at step 52. At step 56, the index k is incremented and the decoding process begins. The exemplary decoding process described in this embodiment of the present invention operates as a loop wherein the forward state metrics and reverse state metrics are calculated in parallel, thus reducing the decoding delay. The processing methodology varies slightly depending upon whether the number of symbols N in the received sequence is even or odd.

In the first part of the loop, i.e., including steps 56–62, a portion of the branch transition metrics, the forward state metrics and the reverse state metrics for the received sequence are calculated and stored. Specifically, from step k=1 up to step k=N/2 (if N is even) or k=N/2−1/2 (if N is odd), the BTMs with index k and N−k+1 (step 58), the FSMs with index k (step 60) and the RSMs with index N−k are calculated (step 60). The FSMs and RSMs are stored in units 36 and 38, respectively. At this point, as determined in decision block 62, the decoding process has sufficient metric data to begin calculating the likelihood ratios while the remaining metrics are being calculated so the process is expanded to include likelihood ratio calculation.

If there are an odd number of symbols N in the received sequence, then only one likelihood ratio is calculated during the first iteration of the expanded loop. Thus, at step 64, if k=N/2+1/2 (i.e., which will be true only if N is odd) the process flow proceeds to step 66 where the LR with index N/2+1/2 is calculated using $\alpha_{k-1}(S_{k-1})$, $\gamma_k(S_{k-1},S_k)$ and $\beta_k(S_k)$. The flow then loops back to step 56 to increment the index k, calculate and store a new set of metrics and then calculate additional likelihood ratios.

If, on the other hand, N is even or after the first iteration when N is odd, the flow proceeds from block 64 to block 68 wherein two likelihood ratios are calculated for each pass through the loop. Specifically, from step k=N/2+1 (if N is even) or k=N/2+3/2 (if N is odd) up to step k=N, the BTMs with index k and N−k+1, the FSMs with index k, the RSMs with index N−k and the LRs with index k and N−k+1 are calculated and stored. When the decoder has reached step k=N, the process follows the "NO" branch out from decision block 70. Then, the decoded sequence can be output from the decoder at step 72.

As mentioned earlier, the timing and control unit 40 (FIG. 2) controls the calculation of metrics and passing of values between the various calculating units to achieve the exemplary decoding process described above with respect to FIG. 3. Since the forward state metrics and reverse state metrics are processed in parallel, and because the forward state metrics are calculated beginning with the first symbol in the received sequence and the reverse state metrics are calculated beginning with the last symbol in the received sequence, there is a period of time during which metrics are calculated for the received sequence, but likelihood ratios are not. As described above, once the index k reaches N/2, likelihood ratio calculation can commence. This timing aspect of exemplary embodiments of the present invention can best be visualized using the timing diagrams of FIGS. 4 and 5, wherein the same naming conventions are used as in FIGS. 2 and 3 above.

Figure 4:
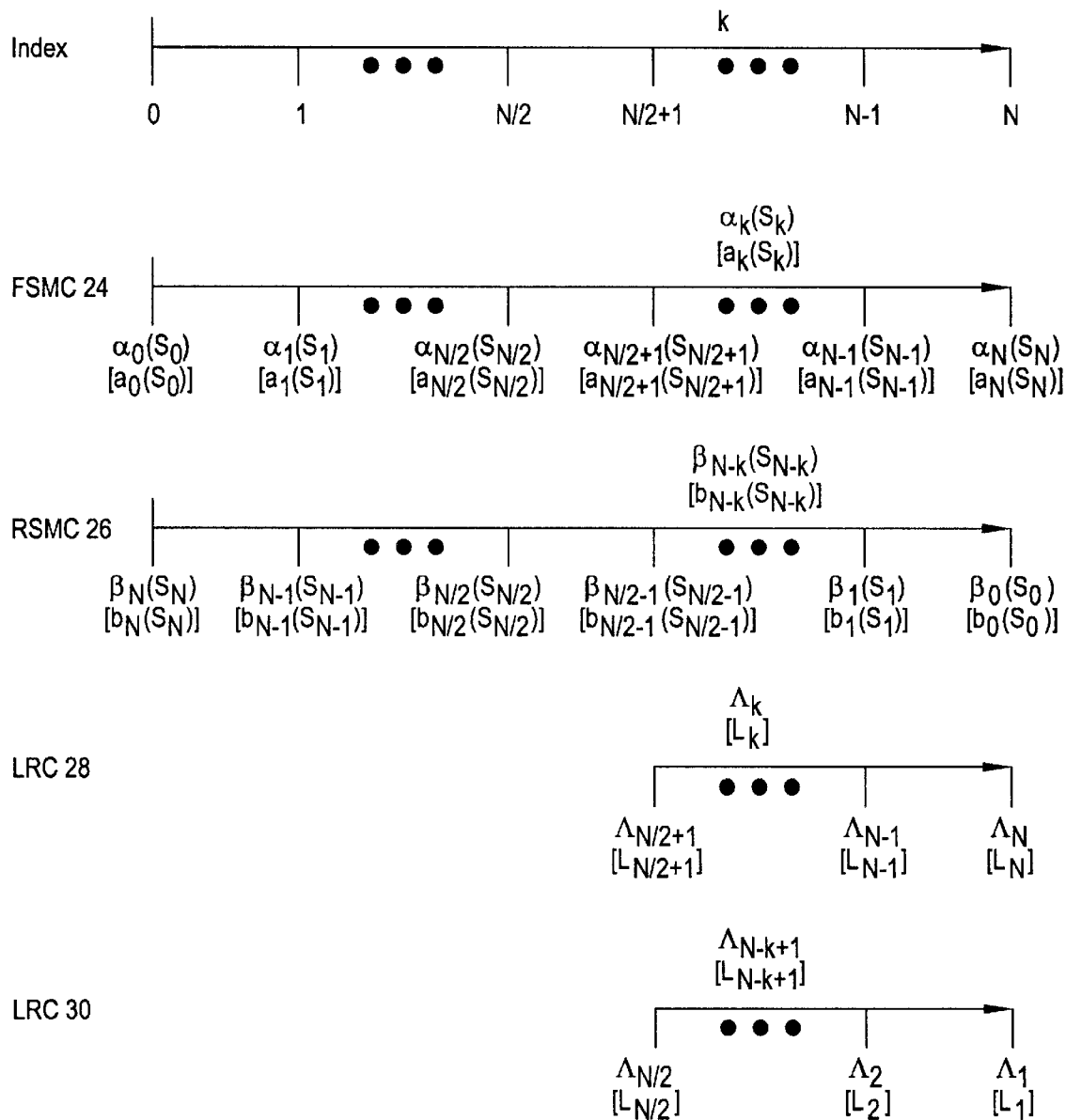
FIG. 4 is a timing diagram which illustrates timing aspects of the operation of the exemplary decoder of FIG. 2 and exemplary process of FIG. 3.

FIG. 4 illustrates the timing associated with metric and likelihood ratio calculations when N is even. Therein, it can be seen that at time k=0, FSMC 24 outputs an initial forward state metric and, concurrently therewith, RSMC 26 outputs an initial reverse state metric. However, LRCs 28 and 30 do not provide likelihood ratios at this time. As the index k increments, FSMC 24 and RSMC 26 continue to output forward and reverse metrics. When k=N/2+1, the LRC units 28 and 30 both begin to output likelihood ratios using the previously calculated and stored forward and reverse state metrics. This continues until k=N.

Figure 5:
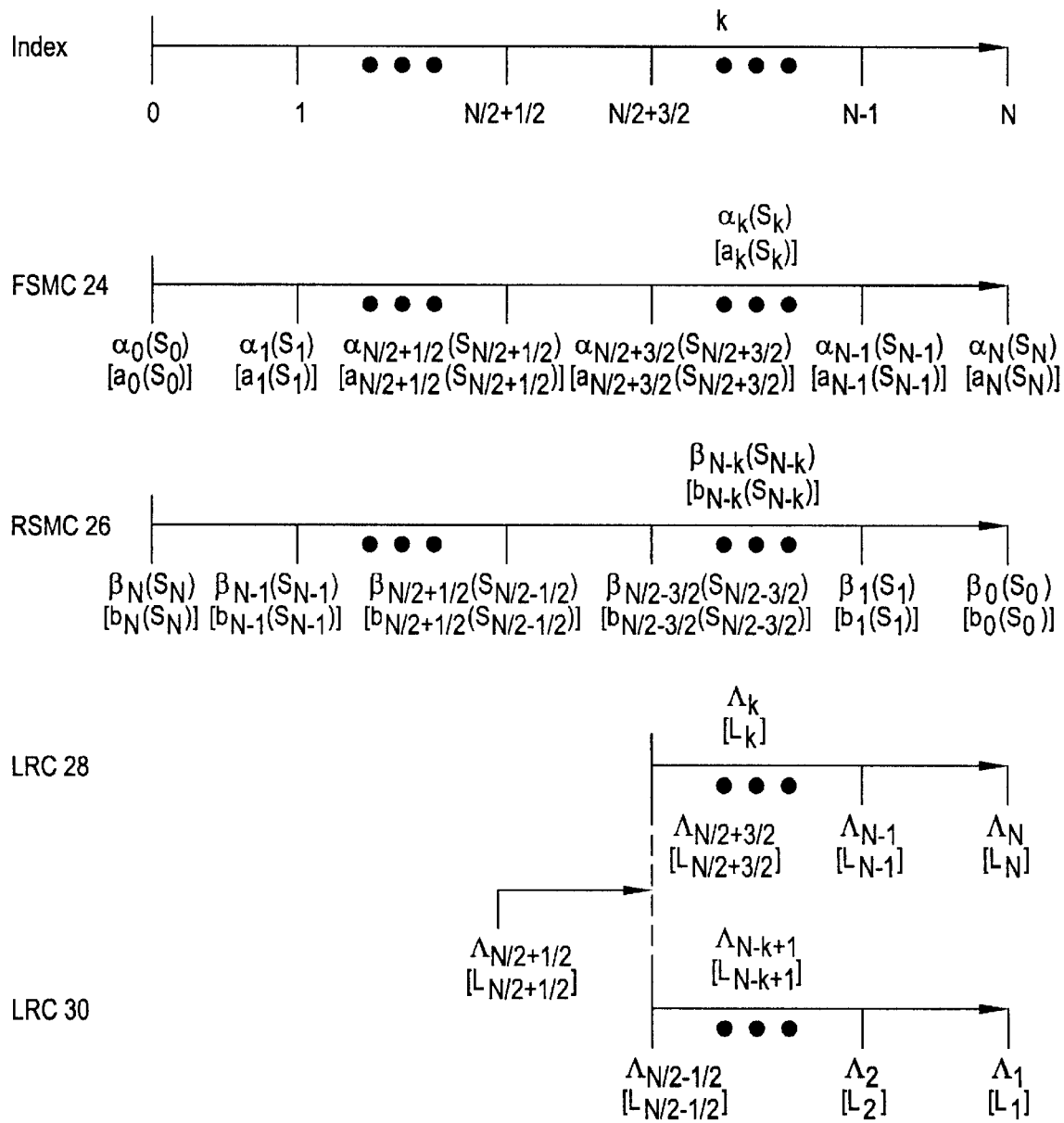
FIG. 5 is another timing diagram which illustrates timing aspects of the operation of the exemplary decoder of FIG. 2 and exemplary process of FIG. 3.

FIG. 5 illustrates the timing associated with metric and likelihood ratio calculations when N is odd. Therein, it can be seen that, once again, at time k=0, FSMC 24 outputs an initial forward state metric and, concurrently therewith, RSMC 26 outputs an initial reverse state metric. However, LRCs 28 and 30 do not provide likelihood ratios at this time. As the index k increments, FSMC 24 and RSMC 26 continue to output forward and reverse metrics. When k=N/2+1, the LRC unit 30 outputs a first likelihood ratio. Then, when k=N/2+3/2, LRC units 28 and 30 both begin to output likelihood ratios using the previously calculated and stored forward and reverse state metrics. This continues until k=N.

Figure 6:
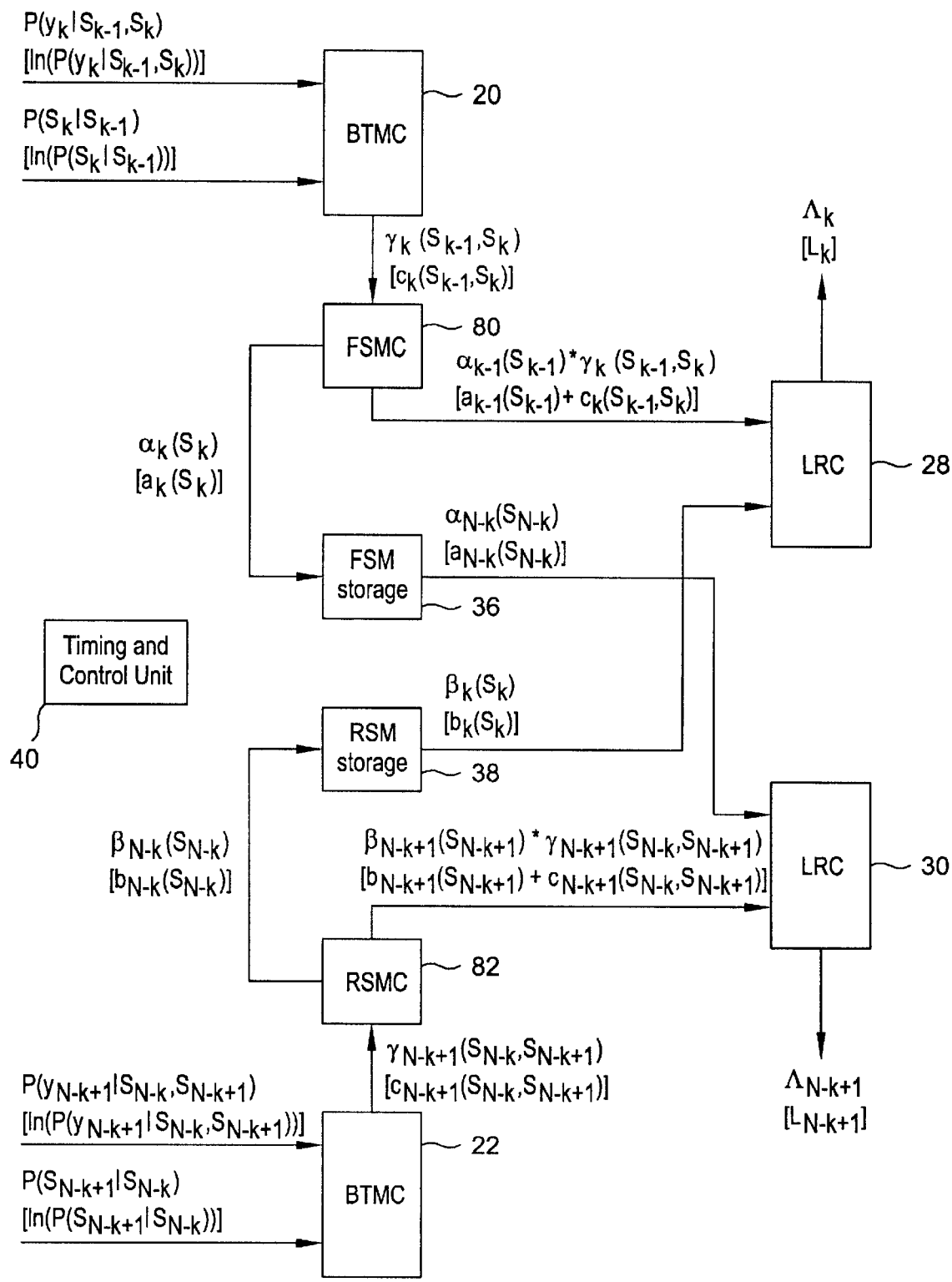
FIG. 6 is a block diagram of a decoder according to another exemplary embodiment of the present invention.

In calculating the likelihood ratios according to the afore-described equations, it will be seen that portions of the calculations used to determine the forward state metrics and reverse state metrics are repeated during the calculation of the likelihood ratio. Specifically, the multiplication (or addition) of the forward state metric with the branch state metric and the multiplication (or addition) of the reverse state metric with the branch state metric are common operations (e.g.,compare equation (2) with equation (4)). Thus, according to another exemplary embodiment of the present invention illustrated in FIG. 6, these common operations need only be performed once, i.e., during metric calculation rather than during both metric calculation and likelihood ratio calculation. In this figure, the reference numerals common to the units having the same inputs and outputs as the decoder of FIG. 2 are reused, as are the signal naming conventions. Thus, only FSMC 80 and RSMC 82 have different reference numerals and different outputs. It will also be noted that the delay elements 32 and 34 are omitted in the decoder of FIG. 6 since the FSMs and RSMs are used directly by the LRC units 28 and 30, respectively.

Other variations on these exemplary embodiments will also be apparent to those skilled in the art. For example, if the processing delay of the BTMC units 20 and 22 is less than or equal to one-half of the processing delay of the FSMC unit and RSMC unit, respectively, then one BTMC unit can be eliminated from the decoders illustrated in FIGS. 2 and 6. For example, a single BTMC unit can be provided which alternately supplies a branch transition metric to the FSMC unit and the RSMC unit. A multiplexer (not shown) can be provided at the output of the BTMC unit to switch its output between the FSMC and the RSMC unit. Of course, the inputs to the single BTMC will also need to switch between those needed to calculate the branch metrics from the beginning of the sequence trellis and those needed to calculate the branch metrics from the end of the sequence trellis.

Likewise, if the LRC units 28 and 30 have a processing delay that is less than or equal to one-half of the processing delay associated with the FSMC and the RSMC units, respectively, then one of the LRC units can also be eliminated. In such an embodiment, a demultiplexer (not shown) can be provided to alternately switch the outputs of the FSMC and RSMC to the input of the single LRC unit. According to yet another exemplary embodiment of the present invention, pipeline processing techniques can be used to combine the FSMC and RSMC units to further reduce the complexity of decoders according to the present invention.

Decoding techniques according to the present invention are applicable to any communication system and/or environment. However, as described above, these MAP decoding techniques (and variants thereof) may find particular application in the radiocommunication environment wherein the transmission channel 12 is an air interface and the encoder 10 and decoder 14 are part of a base station and a mobile station (or vice versa). To provide some very general context, FIG. 7 and the following description provide some general discussion of such an exemplary system in which the present invention can be implemented.

Figure 7:
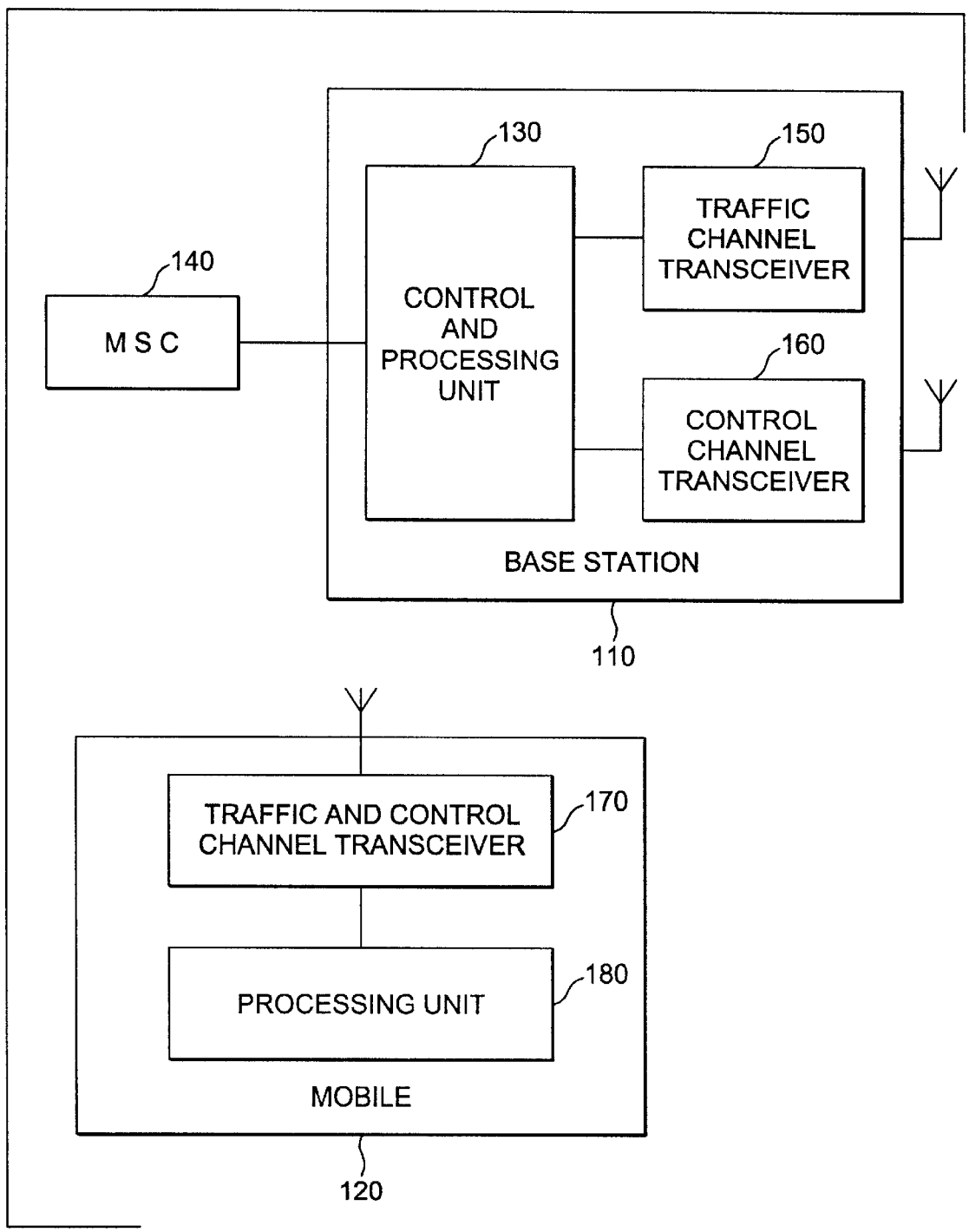
FIG. 7 is a diagram of an exemplary radiocommunication system in which the present invention may be employed.

FIG. 7 represents a block diagram of an exemplary cellular mobile radiotelephone system, including an exemplary base station 110 and mobile station 120. The base station includes a control and processing unit 130 which is connected to the MSC 140 which in turn is connected to the PSTN (not shown). General aspects of such cellular radiotelephone systems are known in the art, as described for example by U.S. Pat. No. 5,175,867 to Wejke et al., entitled "Neighbor-Assisted Handoff in a Cellular Communication System," and U.S. Pat. No. 5,603,081 to Raith et al.,entitled "A Method for Communicating in a Wireless Communication System", the disclosures of both of which are incorporated in this application by reference.

The base station 110 handles a plurality of voice/data (i.e., traffic) channels through a traffic channel transceiver 150, which is controlled by the control and processing unit 130. Also, each base station includes a control channel transceiver 160, which may be capable of handling more than one control channel. The control channel transceiver 160 is controlled by the control and processing unit 130. The control channel transceiver 160 broadcasts control information over the control channel of the base station or cell to mobiles locked to that control channel. It will be understood that the transceivers 150 and 160 can be implemented as a single device, like the traffic and control transceiver 170, and that the assignment of transceivers to antennas need not be dedicated. As part of the signal processing performed therein, the base station 110 can include a decoder, as described above, for removing the error correction coding associated with signals transmitted by mobile station 120 on either a control channel or a traffic channel.

The mobile station 120 receives the information broadcast on a control channel at its traffic and control channel transceiver 170. Again, as part of the processing of this received information, mobile station 120 can include a decoder as described above with respect to any of the foregoing, exemplary embodiments. Then, the processing unit 180 evaluates the received control channel information, which includes the characteristics of cells that are candidates for the mobile station to lock on to, and determines on which cell the mobile should lock. Processing unit 180 also decodes and demodulates the information received on a traffic channel, once one has been assigned to mobile station 120.

Although the invention has been described in detail with reference only to a few exemplary embodiments, those skilled in the art will appreciate that various modifications can be made without departing from the invention. For example, the processes described above may be used to decode turbo coded received signal sequences, wherein the likelihood ratios are calculated for a sequence prior to any hard decisions being made regarding received symbol values. Thus, the present invention is seen to be equally applicable to decoding techniques wherein soft information is being generated in tandem with, prior to or even without hard symbol decisions being made.

Accordingly, the invention is defined only by the following claims which are intended to embrace all equivalents thereof.

What is claimed is:

1. A method for decoding a sequence of N received symbols in accordance with a MAP algorithm, said method comprising the steps of:

calculating first branch transition metrics;

calculating second branch transition metrics;

determining forward state metrics based on said first branch transition metrics;

determining, in parallel with said step of determining said forward state metrics, reverse state metrics based on said second branch transition metrics;

calculating, after a predetermined number of said forward state metrics and said reverse state metrics have been determined, likelihood ratios based upon a combination of said branch transition metrics, said forward state metrics and said reverse state metrics; and decoding said sequence of received symbols using said likelihood ratios.

2. The method of claim 1, wherein said branch transition metrics, said forward state metrics, said reverse state metrics and said likelihood ratios are calculated in accordance with a Log-MAP algorithm.

3. The method of claim 1, wherein said branch transition metrics, said forward state metrics, said reverse state metrics and said likelihood ratios are calculated in accordance with a Max-Log-MAP algorithm.

4. The method of claim 1, wherein said step of calculating said first and second branch transition metrics further comprises the step of:

calculating said first and second branch transition metrics in parallel.

5. The method of claim 1, wherein said step of calculating said first and second branch transition metrics further comprises the step of:

alternately calculating said first and second branch transition metrics.

6. The method of claim 1, wherein said step of calculating said likelihood ratios further comprises the step of:

calculating two likelihood ratios in parallel.

7. The method of claim 1, wherein said step of calculating said likelihood ratios further comprises the step of:

alternately calculating:

a first likelihood ratio based upon one of said forward state metrics, one of said reverse state metrics and one of said first branch transition metrics; and a second likelihood ratio based upon one of said forward state metrics, one of said reverse state metrics and one of said second branch transition metrics.

8. The method of claim 1, wherein said parallel steps of determining said forward and reverse state metrics are performed using pipelined processing techniques.

9. The method of claim 1, further comprising the steps of:

storing said forward state metrics and said reverse state metrics.

10. The method of claim 9, further comprising the step of:

storing said first and second branch transition metrics.

11. The method of claim 1, wherein said step of decoding further comprises the step of:

taking hard decisions on symbol values for sequence of received symbols after all of the likelihood ratios have been calculated for said sequence.

12. A method for decoding a sequence of N recieved symbols comprising the steps of:

(a) initializing an index k;

(b) incrementing said index k;

(c) calculating a first branch transition metric based on said sequence of recieved symbols;

(d) calculating a second branch transition metric based on said sequence of recieved symbols;

(e) determining a forward state metric based on said first branch transition metric;

(f) storing said reverse state metric;

(g) determining, in parallel with said step of determining said forward state metric, a reverse state metric based on said second branch transition metric;

(h) storing said reverse state metric;

(i) repeating steps (b)–(h) as long as k≦N/2, then beginning to calculate likelihood ratios based upon said forward state metrics and said reverse state metrics; and (j) decoding said sequence of recieved symbols using said likelihood ratios.

13. The method of claim 12, wherein said branch transition metrics, said forward state metrics, said reverse state metrics and said likelihood ratios are calculated in accordance with a MAP algorithm.

14. The method of claim 12, wherein said branch transition metrics, said forward state metrics, said reverse state metrics and said likelihood ratios are calculated in accordance with a Log-MAP algorithm.

15. The method of claim 12, wherein said branch transition metrics, said forward state metrics, said reverse state metrics and said likelihood ratios are calculated in accordance with a Max-Log-MAP algorithm.

16. The method of claim 12, wherein said step of calculating said first and second branch transition metrics further comprises the step of:

calculating said first and second branch transition metrics in parallel.

17. The method of claim 12, wherein said step of calculating said first and second branch transition metrics further comprises the step of:

alternately calculating said first and second branch transition metrics using a same processing unit.

18. The method of claim 12, wherein said step of calculating said likelihood ratios further comprises the step of:

calculating two likelihood ratios in parallel.

19. The method of claim 12, wherein said step of calculating said likelihood ratios further comprises the step of:

alternately calculating:
- a first likelihood ratio based upon one of said forward state metrics, one of said reverse state metrics and one of said first branch transition metrics; and
- a second likelihood ratio based upon one of said forward state metrics, one of said reverse state metrics and one of said second branch transition metrics.

20. The method of claim 12, wherein said parallel steps of determining said forward and reverse state metrics are performed using pipelined processing techniques.

21. The method of claim 12, said step of decoding further comprises the step of:

taking hard decisions on symbol values for said sequence of received symbols after all of the likelihood ratios have been calculated for said sequence.

22. A transceiver for receiving a signal comprising:
- a receive processing unit for receiving a sequence of N symbols to be decoded; and
- a MAP error correction decoder for decoding said sequence, wherein said MAP error correction decoder is configured to decode said sequence by:
  - determining, in parallel, forward and reverse state metrics; and
  - calculating likelihood ratios after a predetermined number of said forward and reverse state metrics have been determined.

23. The transceiver of claim 22, wherein said MAP error correction decoder calculates said forward and reverse state metrics using a Log-MAP algorithm.

24. The transceiver of claim 22, wherein said MAP error correction decoder calculates said forward and reverse state metrics using a Max-Log-MAP algorithm.

* * * * *